(12) United States Patent
Yin et al.

(10) Patent No.: US 10,978,441 B2
(45) Date of Patent: Apr. 13, 2021

(54) TRANSIENT VOLTAGE SUPPRESSOR AND METHOD FOR MANUFACTURING THE SAME

(71) Applicant: Silergy Semiconductor Technology (Hangzhou) Ltd., Hangzhou (CN)

(72) Inventors: Dengping Yin, Hangzhou (CN); Shijun Wang, Hangzhou (CN); Fei Yao, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 708 days.

(21) Appl. No.: 15/711,146

(22) Filed: Sep. 21, 2017

(65) Prior Publication Data

US 2018/0090477 A1 Mar. 29, 2018

(30) Foreign Application Priority Data

Sep. 23, 2016 (CN) .......................... 201610845693.3

(51) Int. Cl.
*H01L 27/00* (2006.01)
*H01L 27/02* (2006.01)
(Continued)

(52) U.S. Cl.
CPC .... *H01L 27/0248* (2013.01); *H01L 21/02293* (2013.01); *H01L 21/02697* (2013.01);
(Continued)

(58) Field of Classification Search
CPC ........... H01L 27/0248; H01L 21/02293; H01L 21/02697; H01L 27/0255; H01L 29/861; H01L 29/402; H02H 9/04
See application file for complete search history.

(56) References Cited

U.S. PATENT DOCUMENTS

| 4,736,271 A | * | 4/1988 | Mack | ...................... H01L 21/74 361/56 |
|---|---|---|---|---|
| 7,700,977 B2 | * | 4/2010 | Church | ............... H01L 27/0814 257/199 |

(Continued)

FOREIGN PATENT DOCUMENTS

| CN | 105261616 A | 1/2016 |
|---|---|---|
| CN | 106449633 A | 2/2017 |

*Primary Examiner* — Pete T Lee
(74) *Attorney, Agent, or Firm* — Westman, Champlin & Koehler, P.A.

(57) ABSTRACT

Disclosed a transient voltage suppressor and a method for manufacturing the same. According to the transient voltage suppressor, an additional gate stack layer is introduced based on the prior transient voltage suppressor, and the diffusion isolation regions are reused as the conductive vias, so that, the gate stack layer, the first doped region, the conductive vias, and the second semiconductor layer constitute a MOS transistor being coupled in parallel to the Zener diode or the avalanche diode of the transient voltage suppressor. When the current of the I/O terminal is relatively large, the MOS transistor is turned on to share part of the current of the I/O terminal through the Zener diode or the avalanche diode, thereby protecting the Zener diode or the avalanche diode from being damaged due to excessive current. Thus, the robustness of the transient voltage suppressor is improved without increasing the manufacture cost.

9 Claims, 4 Drawing Sheets

(51) Int. Cl.
*H01L 29/861* (2006.01)
*H01L 21/02* (2006.01)
*H02H 9/04* (2006.01)
*H01L 29/40* (2006.01)

(52) U.S. Cl.
CPC ........ *H01L 27/0255* (2013.01); *H01L 29/861* (2013.01); *H02H 9/04* (2013.01); *H01L 29/402* (2013.01)

(56) References Cited

U.S. PATENT DOCUMENTS

| | | | |
|---|---|---|---|
| 10,361,557 B2 * | 7/2019 | Tanaka | H01L 27/0255 |
| 2016/0276496 A1 * | 9/2016 | Simola | H01L 29/0653 |
| 2017/0084601 A1 | 3/2017 | Yao et al. | |

* cited by examiner

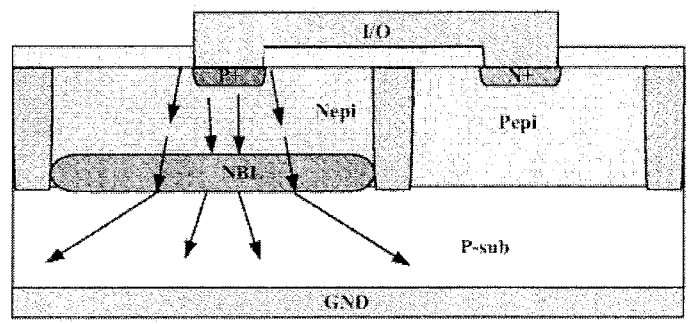
FIG.1a
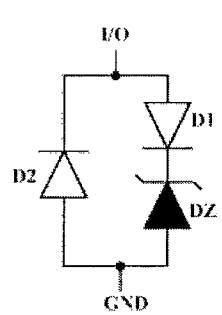 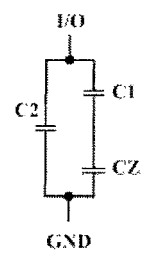
FIG.1b   FIG.1c

TRANSIENT VOLTAGE SUPPRESSOR AND METHOD FOR MANUFACTURING THE SAME

CROSS-REFERENCE TO RELATED APPLICATION

This application claims the benefit of Chinese Patent Application No. 201610845693.3, filed on Sep. 23, 2016, which are incorporated herein by reference in its entirety.

BACKGROUND OF THE DISCLOSURE

Field of the Disclosure

The present disclosure relates to a semiconductor device and a method for manufacturing the same, and in particular, to a transient voltage suppressor and a method for manufacturing the same.

Background of the Disclosure

Transient voltage suppressors (TVS) are used to protect integrated circuits from being damaged by over-voltages suddenly occurred on the integrated circuits. As the quantity of the devices including the integrated circuits easily damaged by over-voltages increases, the need for transient voltage suppressors also increases. For example, USB power supplies, data line protectors, video interfaces, high-speed Ethernet devices, laptops, monitors, flat panel displays and so on are all need to employ transient voltage suppressors. High-speed transmission components in these devices requires transient voltage suppressors to have both of a strong protection and a faster response speed, therefore, it is necessary for the transient voltage suppressors to have low parasitic capacitances, such as less than 0.5 pF.

FIG. 1a is a structural diagram of a common transient voltage suppressor in the prior art, FIG. 1b is its equivalent circuit diagram, and FIG. 1c is its capacitance equivalent circuit diagram. In FIG. 1a, an N-type buried layer NBL and P-type substrate P-sub constitute a Zener diode DZ in FIG. 1b, a P-type doped region P+ and an N-type epitaxial layer Nepi constitute a rectifier diode D1 in FIG. 1b, and an N-type doped region N+ and a P-type epitaxial layer Pepi constitute a rectifier diode D2 in FIG. 1b. The Zener diode DZ is coupled to the rectifier diode D1 in series and then coupled to the rectifier diode D2 in parallel between the terminals I/O and GND. When a positive electrostatic discharge voltage occurs at the I/O terminal, an electrostatic current flows from the rectifier diode D1, Zener diode DZ to the GND terminal, the rectifier diode D1 is forward biased, the Zener diode DZ is broken down reversely, so that a voltage of the I/O terminal is clamped at a relatively small value. When a negative electrostatic discharge voltage occurs at the I/O terminal, the electrostatic current flows through the rectifier diode D2 to GND and the rectifier diode D1 is reversely biased. It is known by the capacitance equivalent circuit shown in FIG. 1c that the capacitance CI/O-GND between the terminals I/O and GND is equal to $C1*CZ/(C1+CZ)+C2$. Due to the Zener diode DZ serving as an ESD protection device, in order to realize a strong ESD protection, the Zener diode DZ needs to have a relatively large PN junction area, that means, the N-type buried layer NBL should have a large area, therefore, CZ is inevitably large, and CI/O-GND is approximately equal to $C1+C2$.

Thus, a prior transient voltage suppressor, in order to decrease its parasitic capacitance, can only reduce the capacitance C1 and C2 as much as possible. The junction area of the diode D1 can only be reduced by reducing the area of the P-type doped region P+. However, if the junction area of the diode D1 is designed to be small, the robustness of the transient voltage suppressor will be affected, that means, the transient voltage suppressor cannot withstand a large surge current or a large electrostatic current. As shown in FIG. 1a, when the current of the I/O terminal flows from the heavily-doped P-type region P+ to an N-type epitaxial Npei, then to the N-type buried layer NBL, and finally through a P-type substrate P_Sub to the GND terminal, if the area of the doped region P+ is quite small comparing with that of the buried layer NBL, only one portion of the PN junction (the portion under the doped region P+) formed by NBL and P-Sub is used to flow most of the current of the I/O terminal, so that, the temperature of this portion may be raised due to the highly concentrated current, which may damage the Zener diode DZ, resulting in failure of the transient voltage suppression. Therefore, the prior transient voltage suppressor cannot implement better robustness as obtaining a low capacitance value.

SUMMARY OF THE DISCLOSURE

In view of this, there is provided a transient voltage suppressor and a method for manufacturing the same, the transient voltage suppressor can have better robustness and meanwhile obtaining a low parasitic capacitance.

According to a first aspect of the disclosure, there is provided a transient voltage suppressor, comprising:
a first semiconductor layer with a first doping type;
a first buried layer with a second doping type, which is located in the first semiconductor layer and exposed by the first semiconductor layer;
a second semiconductor layer with the second doping type, which is located on the first buried layer;
a first doped region with the first doping type, which is located in the second semiconductor layer and exposed by the second semiconductor layer;
a gate stack layer on the second semiconductor layer, which comprises a gate dielectric layer and a gate conductor layer on the gate dielectric layer;
conductive vias with the first doping type, which are adjacent to the gate stack layer and extend to the first semiconductor layer or into the first semiconductor layer;
a first electrode electrically connected with the first doped region;
a second electrode electrically connected with the gate conductor layer; and
a third electrode electrically connected with the first semiconductor layer,
wherein the second electrode and the third electrode are connected electrically.

Preferably, when a voltage difference between the second electrode and the first electrode reaches a first voltage threshold, an inversion layer with the first doping type is formed on a surface of the second semiconductor layer under the gate stack layer and the first doped region is electrically connected with the conductive vias through the inversion layer.

Preferably, the first voltage threshold has an absolute value greater than a reverse breakdown voltage of a first PN junction between the first semiconductor layer and the first buried layer.

Preferably, the first voltage threshold has an absolute value greater than twice an applied voltage of the transient voltage suppressor.

Preferably, the first semiconductor layer comprises a semiconductor substrate with the first doping type and a second buried layer with the first doping type, the first buried layer is located in a first region of the semiconductor substrate and exposed by the semiconductor substrate, the second buried layer is located in a second region of the semiconductor substrate and exposed by the semiconductor substrate, the conductive vias extend to the second buried layer or into the second buried layer.

Preferably, the transient voltage suppressor further comprises:

a third semiconductor layer with the first doping type, which is located on the second buried layer;

a second doped region with the second doping type, which is located in the third semiconductor layer and exposed by the third semiconductor layer; and a fourth electrode electrically connected with the second doped region, wherein the fourth electrode and the first electrode are electrically connected.

Preferably, the conductive vias are located at both sides of the second semiconductor layer and are reused as isolation structures of the transient voltage suppressor.

Preferably, the first doping type is P-type, and the second doping type is N-type.

According to a second aspect of the disclosure, there is provided a method for manufacturing a transient voltage suppressor, comprising:

forming a first buried layer with a second doping type in a first semiconductor layer with a first doping type, wherein the first buried layer is exposed by the first semiconductor layer, forming a second semiconductor layer with the second doping type on the first buried layer;

forming a gate stack layer on the second semiconductor layer, wherein the gate stack layer comprises a gate dielectric layer and a gate conductor layer on the gate dielectric layer;

forming a first doped region with the first doping type, which is adjacent to one side of the gate stack layer and exposed by the second semiconductor layer, in the second semiconductor layer;

forming conductive vias adjacent to the other side of the gate stack layer and extending to the first semiconductor layer or into the first semiconductor layer;

forming a first electrode electrically connected with the first doped region;

forming a second electrode electrically connected with the gate conductor layer; and forming a third electrode electrically connected with the first semiconductor layer.

Preferably, the gate stack layer is used as a mask to form the first doped region.

Preferably, the first semiconductor layer comprises a semiconductor substrate with the first doping type and a second buried layer with the first doping type, so that, the first buried layer and the second buried layer are respectively formed in the semiconductor substrate and both exposed by the semiconductor substrate, the second buried layer is adjacent to the first buried layer, and the conductive vias extend from both sides of the second semiconductor layer to the second buried layer or into the second buried layer.

Preferably, the step of forming the second semiconductor layer comprises:

forming an epitaxial layer on the first semiconductor layer and the first buried layer by epitaxial growth, due to self-doping of the first buried layer and the second buried layer, a portion of the epitaxial layer on the first buried layer functions as the second semiconductor layer; and a portion of the epitaxial layer on the second buried layer functions as a third semiconductor layer with the first doping type.

Preferably, the method further comprises: forming a second doped region with the second doping type in the third semiconductor layer; and forming a fourth electrode electrically connected with the second doped region and the first electrode.

Preferably, forming the first electrode, the second electrode and the fourth electrode comprises:

forming a patterned insulating layer on the first semiconductor layer and the second semiconductor layer;

exposing the first doped region, the gate conductor layer and the second doped region by the insulating layer, respectively;

and forming a patterned metal layer on the insulating layer by using the insulating layer as a mask, to obtain the first electrode, the second electrode and the fourth electrode.

Preferably, forming the conductive vias comprises:

conducting a diffusion doping process of the first doping type on a surface of the epitaxial layer to form diffusion regions used as the conductive vias and extending from both sides of the second semiconductor layer to the second buried layer or into the buried layer.

From above, according to the transient voltage suppressor and the method for manufacturing the same provided by the disclosure, an additional gate stack layer is introduced based on the prior transient voltage suppressor, and the diffusion isolation regions are reused as the conductive vias, so that, the gate stack layer, the first doped region, the conductive vias, and the second semiconductor layer constitute a MOS transistor being coupled in parallel to the Zener diode or the avalanche diode of the transient voltage suppressor. When the current of the I/O terminal is relatively large, the MOS transistor is turned on to share part of the current of the I/O terminal through the Zener diode or the avalanche diode, thereby protecting the Zener diode or the avalanche diode from being damaged due to excessive current. Thus, the robustness of the transient voltage suppressor is improved without increasing the manufacture cost.

BRIEF DESCRIPTION OF THE DRAWINGS

The above and other objects, advantages and features of the present invention will become more fully understood from the detailed description given hereinbelow in connection with the appended drawings, and wherein:

FIG. 1a is a structural diagram of a common transient voltage suppressor in the prior art;

FIG. 1b is an equivalent circuit diagram of the transient voltage suppressor shown in FIG. 1a;

FIG. 1c is an capacitance equivalent circuit diagram of the transient voltage suppressor shown in FIG. 1a;

FIG. 2b is an equivalent circuit diagram of the transient voltage suppressor shown in FIG. 2a;

DETAILED DESCRIPTION OF THE DISCLOSURE

Figure 2A:
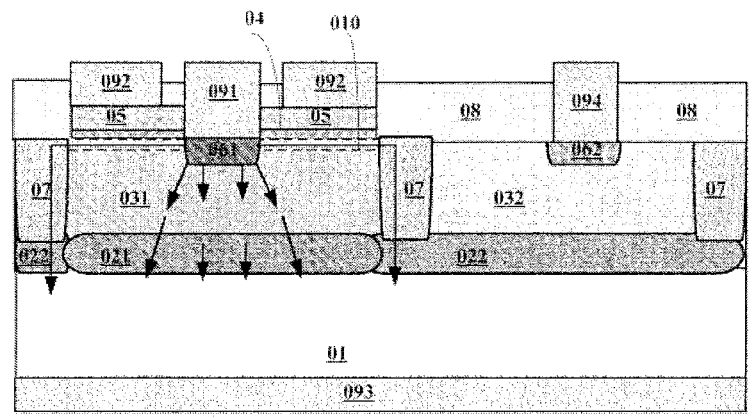
FIG. 2a is a structural diagram of a transient voltage suppressor according to an embodiment of the disclosure.

Exemplary embodiments of the present disclosure will be described in more details below with reference to the accompanying drawings. In the drawings, like reference numerals denote like members. The figures are not drawn to scale, for the sake of clarity. Moreover, some well-known parts may not be shown. For simplicity, the structure having been subject to several relevant process steps may be shown in one figure. Some particular details of the present disclosure will be described below, such as exemplary semiconductor structures, materials, dimensions, process steps and technologies of the members, for better understanding of the present disclosure. However, it can be understood by one skilled person in the art that these details are not always essential but can be varied in a specific implementation of the disclosure.

Figure 2B:
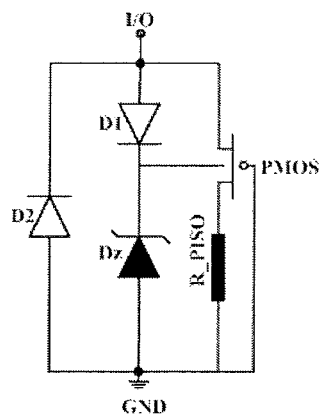

FIG. 2a is a structural diagram of a transient voltage suppressor according to an embodiment of the disclosure and FIG. 2b is an equivalent circuit diagram of the transient voltage suppressor shown in FIG. 2a.

As shown in FIG. 2a, the transient voltage suppressor according to the embodiment includes a first semiconductor layer with a first doping type, a buried layer 021 with a second doping type, a second semiconductor layer 031 with the second doping type, a first doped region 061 with the first doping type, a gate stack layer, conductive vias 07 with the first doping type, a first electrode 091, a second electrode 092 and a third electrode 093. The first buried layer 021 is located in the first semiconductor layer and exposed by the first semiconductor layer, the second semiconductor layer 031 is located on the first buried layer 021, the first doped region 061 is located in the second semiconductor layer 031 and exposed by the second semiconductor layer 031, the gate stack layer includes a gate dielectric layer 04 and a gate conductor layer 05 on the gate dielectric layer 04, the conductive vias 07 are adjacent to the gate stack layer and extend to the first semiconductor layer or into the first semiconductor layer, the first electrode 091 is electrically connected with the first doped region 061, the second electrode 092 is electrically connected with the gate conductor layer 05, the third electrode 093 is electrically connected with the first semiconductor layer and the second electrode 092. When a voltage difference between the second electrode 092 and the first electrode 091 reaches a first voltage threshold, an inversion layer 010 with the first doping type is formed on a surface of the second semiconductor layer 031 under the gate stack layer, and the first doped region 061 is electrically connected with the conductive vias through the inversion layer 010.

In the embodiment, the first doping type is P-type and the second doping type is N-type, in other embodiments, if the first doping type is N-type, then the second doping type is P-type. Moreover, in the embodiment, the first electrode is used as an I/O terminal of the transient voltage suppressor and the third electrode is used as a GND terminal of the transient voltage suppressor.

In connection with FIG. 2a and FIG. 2b, the first semiconductor layer and the first N-type buried layer 021 constitute a voltage regulator diode DZ having reverse breakdown characteristic in the transient voltage suppressor, the diode DZ in the embodiment is a Zener diode, but in other embodiments, it can be an avalanche diode. The first P-type doped region 061 and the second semiconductor layer 021 constitute a rectifier diode D1 in the transient voltage suppressor, the cathodes of the rectifier diode D1 and the Zener diode DZ are connected, and their anodes are connected with the I/O terminal and the GND terminal, respectively.

Moreover, in the embodiment, the gate stack layer, the first doped region 061, and the conductive vias 07 constitute a PMOS transistor, the first doped region 061 and the conductive via 07 are respectively used as a source electrode and a drain electrode of the PMOS transistor shown in FIG. 2b, and the gate conductor layer 05 is used as a gate electrode of the PMOS transistor. The gate and the drain electrodes of the PMOS transistor are connected to the GND terminal, and the PMOS transistor can be equivalent to a resistor R_PISO since the conductive via 07 has a certain resistivity. As shown in FIG. 2b, the drain electrode of the PMOS transistor is connected to the GND terminal through the resistor R_IPS0, and because the second semiconductor layer 031 is used as the substrate of the PMOS transistor, the substrate of the PMOS transistor is connected with the cathode of the Zener diode.

Moreover, in the embodiment, as shown in FIG. 2b, the transient voltage suppressor further includes a second rectifier diode D2, the anode of the second rectifier diode D2 is connected with the GND terminal and its cathode is connected with the I/O terminal. The second rectifier diode D2 can be formed on a same wafer together with the first rectifier diode D1, the Zener diode DZ, or on a different wafer, and then the different wafers can be connected with each other by external wires or conductive bumps.

In the embodiment, the second rectifier diode D2, the first rectifier diode D1, and the Zener diode DZ are formed on a same wafer. As shown in FIG. 2a, in the embodiment, the first semiconductor layer includes a semiconductor substrate 01 with the first doping type and the second buried layer 022 in the semiconductor substrate 01, the doping type of the second buried layer 022 is the first doping type, i.e., P-type. The first buried layer 021 is located in a first region of the semiconductor substrate 01 and exposed by the semiconductor layer 01, and the second buried layer 022 is located in a second region of the semiconductor substrate 01 and exposed by the semiconductor substrate 01. The conductive vias 07 extend from a first side of the second semiconductor layer 031 to the second buried layer 022 or into the second buried layer 022. Moreover, the transient voltage suppressor further includes a third semiconductor layer 032 with the first doping type, a second doped region 062 with the second doping type, and a fourth electrode 094. The third semiconductor layer 032 is located on the second buried layer 022, the second doped region 062 is located in the third semiconductor layer 032 and exposed by the third semiconductor layer 032, the fourth electrode 094 is electrically connected with the second doped region 062 and the first electrode 091. The second doped region 062 and the third semiconductor layer 032 constitute the PN junction of the second rectifier diode D2.

In the embodiment, the first region and the second region of the semiconductor substrate 01 are adjacent to each other, that is, the second buried layer 022 is located on an outer side of the first buried layer 021 and is adjacent to the first buried layer 021. The second semiconductor layer 031 and the third semiconductor layer 032 are formed on a same horizontal plane, that is, their lower surfaces and upper surfaces are both coplanar. The conductive vias 07 are located on both sides of the second semiconductor layer 032 and reused as isolation structures of the transient voltage suppressor, for example, the conductive via 07 includes a portion between the second semiconductor layer and the third semiconductor layer, this portion can serve as an isolation structure between a first conductive path formed by the rectifier diode D2 and a second conductive path formed by the rectifier diode D1 and the Zener diode DZ. Therefore, in the embodiment, the conductive vias 07 are P-type doped diffusion isolation regions. Moreover, in the embodiment, the transient voltage suppressor further includes an insulating layer 08, such as SiO2, the first electrode 091, the second electrode 092, the fourth electrode 094 pass through the insulating layer 08 to electrically connect with the first doped region 061, the gate conductor layer 05 and the second doped region 062, respectively.

When the transient voltage suppressor shown in FIGS. 2*a* and 2*b* is applied to other electronic system for suppressing transient voltages, the I/O terminal is connected with a transient voltage protection terminal of the protected electronic system. When the protected electronic system operates normally, the transient voltage suppressor needs to be turned-off, that is, the first conductive path formed by the rectifier diode D2 and the second conductive path formed by the rectifier diode D1 and the Zener diode DZ all need to be in a turned-off state. Therefore, the first PN junction consisting of the first semiconductor layer and the first buried layer, i.e., the PN junction of the Zener diode DZ, has a reverse breakdown voltage which is required to be greater than the applied voltage of the protected electronic system (i.e., the operating voltage of the electronic system when the electronic system operates normally). Moreover, the third conductive path consisting of the PMOS transistor needs to be in a turned-off state, however, only if the absolute value of the first voltage threshold is greater than the voltage of the I/O terminal when the electronic system operates normally, the PMOS transistor can be in a turned-off state, so that, the absolute value of the first voltage threshold should be greater than the applied voltage of the electronic system, for example, the absolute value of the voltage threshold should usually be greater than twice the applied voltage, to avoid the disadvantage of low efficiency due to the electronic system discharging current through the transient voltage suppressor. In the embodiment, the first voltage threshold, which is a turn-on voltage of the PMOS transistor, is negative, and in other embodiments, if the first doping type is N-type and the PMOS transistor is replaced by an NMOS transistor, the first voltage threshold is a turn-on voltage of the NMOS transistor.

When the voltage of the I/O terminal reaches the reverse breakdown voltage of the first PN junction, i.e., the reverse breakdown voltage of the Zener diode DZ, the Zener diode DZ is reversely broken down, and at the time, the first path is still in a turned-off state, and the second path is in a turned-on state, the voltage of the I/O terminal is clamped to a certain value by the Zener diode DZ, so as to suppress the transient voltage of the I/O terminal. In order to make the transient voltage suppressor function normally to suppressing the transient voltage, the third path needs to be in the turned-off state before the current of the I/O terminal reaches the first value, that is, the PMOS transistor needs to be turned on at a specific time instant before which the Zener diode DZ is reversely broken down and after which the current of the I/O terminal reaches maximum current that the Zener diode DZ can withstand, so that, the current of the I/O terminal can be partially divided, thereby reducing the burden on the Zener diode DZ and improving the robustness of the transient voltage suppressor. In the embodiment, the absolute value of the first voltage threshold is greater than the reverse breakdown voltage of the first PN junction, so that, it is ensured that the PMOS transistor is turned off before the current of the I/O terminal reaches the maximum current that the Zener diode DZ can withstand. Thus, the normal ability of the transient voltage suppressor for suppressing the transient voltage is not affected.

It is known from FIG. 2*b*, that the PMOS transistor and the Zener diode are coupled in parallel, when the PMOS transistor is turned on, the PMOS transistor is equivalent to the resistor R_IPSO being coupled in parallel with the Zener diode DZ, the current of the I/O terminal can be divided by the resistor R_IPSO at the time, one part of the current of the I/O terminal flows to the GND terminal through a conductive path formed by the first doped region 061, the second semiconductor layer 031, the first buried layer 021 and the semiconductor substrate 01, and the other part of the current of the I/O terminal flows to the GND terminal through a conductive path formed by the first doped region 061, the inversion layer 010, the conductive vias 07, the second buried layer 022 and the semiconductor substrate 01. The smaller the resistance value of the resistor R-PISO is, that is, the higher the doping concentration of the conductive vias is, the larger current can be shared by the resistor R-PISO and the larger current can be withstood by the I/O terminal, thus, the better the robustness of the transient voltage suppressor can be. However, the doping concentration of the conductive vias 07 cannot be excessively high, otherwise the absolute value of the turn-on voltage of the PMOS transistor would be too small which may affect the applied voltage of the transient voltage suppressor and cause an electric leakage through the PMOS transistor when the protected electronic system is operating normally. Thus, in the embodiment, the doping concentration of the conductive vias 07 should be determined according to the applied voltage of the transient voltage suppressor.

From above, in the transient voltage suppressor provided by the disclosure, an additional gate stack layer is introduced based on the prior transient voltage suppressor, and the diffusion isolation regions are reused as the conductive vias, so that, the gate stack layer, the first doped region, the conductive vias, and the second semiconductor layer constitute a MOS transistor being coupled in parallel to the Zener diode or the avalanche diode of the transient voltage suppressor. When the current of the I/O terminal is relatively large, the MOS transistor is turned on to share part of the current of the I/O terminal through the Zener diode or the avalanche diode, thereby protecting the Zener diode or the avalanche diode from being damaged due to excessive current. Thus, the robustness of the transient voltage suppressor is improved without increasing the manufacture cost.

There is provided a method for manufacturing the transient voltage suppressor, as shown in FIG. 3*a* to FIG. 3*e*. FIG. 3*a* to FIG. 3*e* are cross-sectional diagrams respectively showing structures having been formed at various steps of the method for manufacturing the transient voltage suppressor according to an embodiment of the disclosure. The method for manufacturing the transient voltage suppressor according to the embodiment mainly includes the following steps.

At step 1, the first buried layer 021 with the second doping type is formed in the first semiconductor layer with the first doping type, and the first buried layer 021 is exposed by the first semiconductor layer.

Figure 3A:
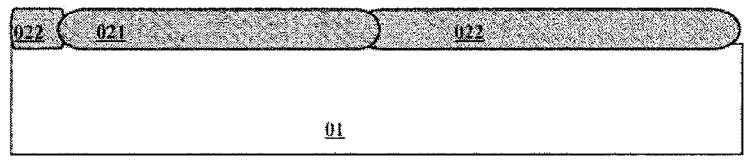
FIG. 3a to FIG. 3e are cross-sectional diagrams showing structures having been formed at various steps of a method for manufacturing a transient voltage suppressor according to an embodiment of the disclosure.
Figure 3B:
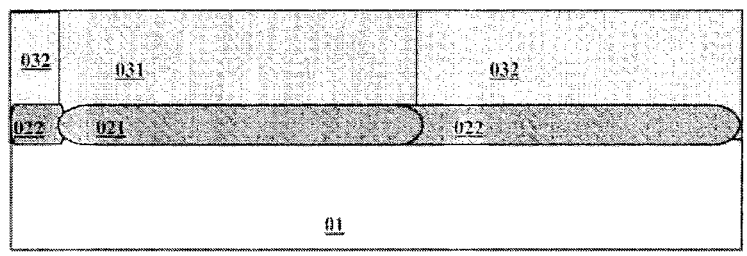

As shown in FIG. 3*b*, in the embodiment, the first semiconductor layer includes the semiconductor substrate 01 with the first doping type and the second buried layer 022 in the semiconductor substrate 01. The first buried layer 021 is formed in a first region of the semiconductor substrate 01 and exposed by the semiconductor substrate 01, and the second buried layer 022 is formed in a second region of the semiconductor substrate 01 and exposed by the semiconductor layer 01. The first region and the second region of the semiconductor substrate 01 are adjacent to each other, that is, the first buried layer 021 and the second buried layer 022 are adjacent to each other, and there is no limitation in time sequence in forming the two buried layers in the semiconductor substrate 01.

At step 2, the second semiconductor layer 031 with the second doping type is formed on the first buried layer 021.

As shown in FIG. 3*b*, in the embodiment, the step of forming the second semiconductor layer 032 includes: forming the epitaxial layer on the first semiconductor layer and the first buried layer 021 by epitaxial growth, due to self-doping of the first buried layer 021 and the second buried layer 022, the portion of the epitaxial layer on the first buried layer 021 functions as the second semiconductor layer, and the portion of the epitaxial layer on the second buried layer functions as a third semiconductor layer 032 with the first doping type. The epitaxial layer is an intrinsic epitaxial layer or a doped epitaxial layer formed by a low concentration doping process.

Figure 3C:
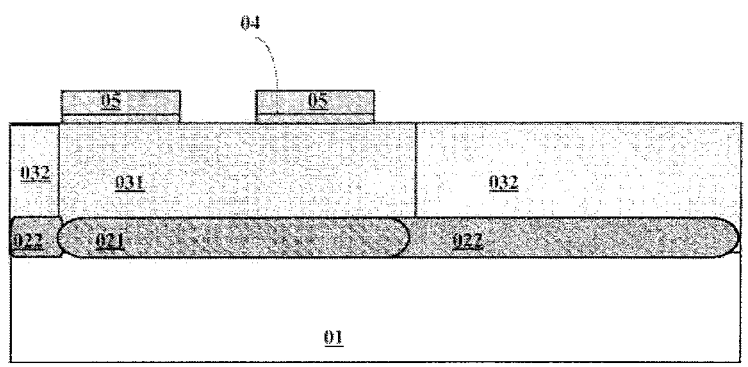

At step 3, as shown in FIG. 3*c*, the gate stack layer is formed on the second semiconductor layer 031, and the gate stack layer includes the gate dielectric layer 04 and the gate conductor layer 05 on the gate dielectric layer 04.

Figure 3D:
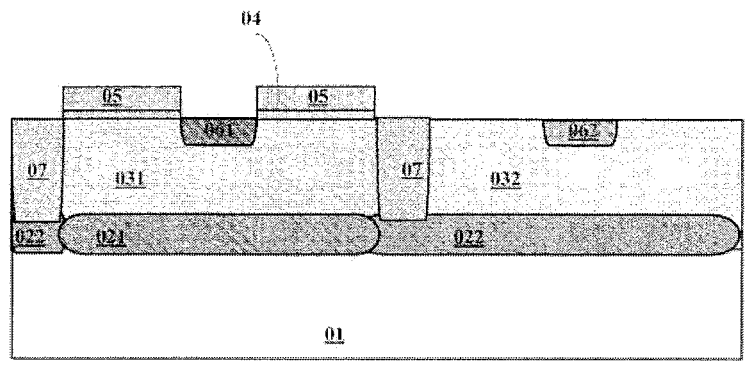

At step 4, as shown in FIG. 3*d*, the first doped region 061 with the first doping type, which is adjacent to one side of the gate stack layer, is formed in the second semiconductor layer 031 and exposed by the second semiconductor layer 031. In the embodiment, after the gate stack layer is formed, the gate stack layer can be used as a mask to form the first doped region, without forming an additional mask. Thus, for the method for manufacturing the transient voltage suppressor according to the disclosure, the gate stack layer is introduced without adding one more lithography process, so that the manufacture cost will not rise too much.

Moreover, before or after the first doped region 061 is formed, the second doped region 062 with the second doping type can be formed in the third semiconductor layer 032, and the second doped region is exposed by the third semiconductor layer 032.

At step 5, the conductive vias 07 are formed, which are adjacent to the other side of the gate stack layer and extend to the first semiconductor layer or into the first semiconductor layer.

With continued reference to FIG. 3*d*, the conductive vias 07 are located at both sides of the first buried layer 021 and the second semiconductor layer 031, and extend from the surface of the epitaxial layer formed at step 2 to the second buried layer 022 or into the second buried layer 022. The step of forming the conductive vias includes: conducting a diffusion doping process of the first doping type on the surface of the epitaxial layer to form diffusion regions used as the conductive vias 07 and extending from both sides of the second semiconductor layer 031 to the second buried layer 022 or into the second buried layer 022.

It should be noted that in other embodiments, the conductive vias 07 can be formed in any of the steps after the step 2 and before the step of forming the electrode of the transient voltage suppressor, and are not limited to be formed at the step 5 of the embodiment.

Figure 3E:
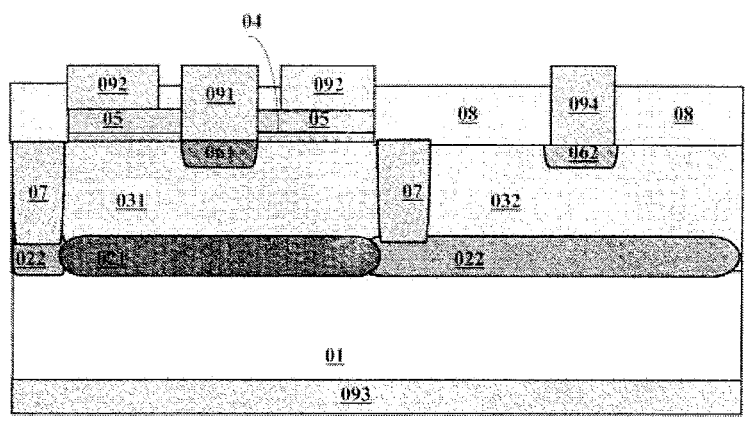

At step 6, as shown in FIG. 3*e*, the first electrode 091 is formed, which is electrically connected with the first doped region 061, the second electrode 092 is formed, which is electrically connected with the gate conductor layer 05, the third electrode 093 is formed, which is electrically connected with the first semiconductor layer, the fourth electrode 094 is formed, which is electrically connected with the second doped region 062, the first electrode 091 is electrically connected with the second electrode 092, and the fourth electrode 094 is electrically connected with the first electrode 091. FIG. 3*e* does not show connection relationship of the various electrodes.

Referring to FIG. 3*e*, the step of forming the first electrode 091, the second electrode 092 and the fourth electrode 094 includes: forming a patterned insulating layer 08 on the first semiconductor layer and the second semiconductor layer 031; exposing the first doped region 061, the gate conductor layer 05 and the second doped region 062 by the insulating layer 08, respectively; and forming a patterned metal layer by using the insulating layer 08 as a mask, to obtain the first electrode 091, the second electrode 092 and the fourth electrode 094.

From above, according to the transient voltage suppressor and the method for manufacturing the same provided by the disclosure, an additional gate stack layer is introduced based on the prior transient voltage suppressor, and the diffusion isolation regions are reused as the conductive vias, so that, the gate stack layer, the first doped region, the conductive vias, and the second semiconductor layer constitute a MOS transistor being coupled in parallel to the Zener diode or the avalanche diode of the transient voltage suppressor. When the current of the I/O terminal is relatively large, the MOS transistor is turned on to share part of the current of the I/O terminal through the Zener diode or the avalanche diode, thereby protecting the Zener diode or the avalanche diode from being damaged due to excessive current.

Thus, the robustness of the transient voltage suppressor is improved without increasing the manufacture cost.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

The invention claimed is:

1. A transient voltage suppressor, comprising:
  a first semiconductor layer with a first doping type;
  a first buried layer with a second doping type, which is located in said first semiconductor layer and exposed by said first semiconductor layer;
  a second semiconductor layer with said second doping type, which is located on said first buried layer;
  a first doped region with said first doping type, which is located in said second semiconductor layer and exposed by said second semiconductor layer;
  a gate stack layer on said second semiconductor layer, which comprises a gate dielectric layer and a gate conductor layer on said gate dielectric layer;
  conductive vias with said first doping type, which are adjacent to said gate stack layer and extend to said first semiconductor layer or into said first semiconductor layer;

a first electrode electrically connected with said first doped region;

a second electrode electrically connected with said gate conductor layer; and a third electrode electrically connected with said first semiconductor layer, wherein said second electrode and said third electrode are connected electrically, said gate stack layer is not in direct contact with said first buried layer.

2. The transient voltage suppressor according to claim 1, wherein, when a voltage difference between said second electrode and said first electrode reaches a first voltage threshold, an inversion layer with said first doping type is formed on a surface of said second semiconductor layer under said gate stack layer and said first doped region is electrically connected with said conductive vias through said inversion layer.

3. The transient voltage suppressor according to claim 2, wherein said first voltage threshold has an absolute value greater than a reverse breakdown voltage of a first PN junction between said first semiconductor layer and said first buried layer.

4. The transient voltage suppressor according to claim 3, wherein said first voltage threshold has an absolute value greater than twice an applied voltage of said transient voltage suppressor.

5. The transient voltage suppressor according to claim 1, wherein said first semiconductor layer comprises a semiconductor substrate with said first doping type and a second buried layer with said first doping type, said first buried layer is located in a first region of said semiconductor substrate and exposed by said semiconductor substrate, said second buried layer is located in a second region of said semiconductor substrate and exposed by said semiconductor substrate, and said conductive vias extend to said second buried layer or into said second buried layer.

6. The transient voltage suppressor according to claim 5, further comprising:

a third semiconductor layer with said first doping type, which is located on said second buried layer;

a second doped region with said second doping type, which is located in said third semiconductor layer and exposed by said third semiconductor layer; and a fourth electrode electrically connected with said second doped region, wherein said fourth electrode and said first electrode are electrically connected.

7. The transient voltage suppressor according to claim 1, wherein said conductive vias are located at both sides of said second semiconductor layer and are reused as isolation structures of said transient voltage suppressor.

8. The transient voltage suppressor according to claim 1, wherein said first doping type is P-type, and said second doping type is N-type.

9. A transient voltage suppressor, comprising:

a first semiconductor layer with a first doping type;

a first buried layer with a second doping type, which is located in said first semiconductor layer and exposed by said first semiconductor layer;

a second semiconductor layer with said second doping type, which is located on said first buried layer;

a first doped region with said first doping type, which is located in said second semiconductor layer and exposed by said second semiconductor layer;

a gate stack layer on said second semiconductor layer, which comprises a gate dielectric layer and a gate conductor layer on said gate dielectric layer;

conductive vias with said first doping type, which are adjacent to said gate stack layer and extend to said first semiconductor layer or into said first semiconductor layer;

a first electrode electrically connected with said first doped region;

a second electrode electrically connected with said gate conductor layer; and a third electrode electrically connected with said first semiconductor layer, wherein said second electrode and said third electrode are connected electrically, said first doped region has a bottom surface lower than a bottom surface of said gate stack layer which covers a top portion of said second semiconductor layer, said top region is located between said first region and one of said conductive vias.

\* \* \* \* \*